United States Patent [19]
Moslehi

[11] Patent Number: 5,447,875
[45] Date of Patent: Sep. 5, 1995

[54] SELF-ALIGNED SILICIDED GATE PROCESS

[75] Inventor: Mehrdad Moslehi, Dallas, Tex.

[73] Assignee: Texas Instruments Incorporated, Dallas, Tex.

[21] Appl. No.: 240,799

[22] Filed: May 11, 1994

Related U.S. Application Data

[63] Continuation of Ser. No. 52,436, Apr. 22, 1993, abandoned.

[51] Int. Cl.⁶ .................. H01L 21/283; H01L 21/336
[52] U.S. Cl. ...................... 437/41; 437/200; 748/DIG. 15; 748/DIG. 19
[58] Field of Search .......... 437/41, 44, 190, 192, 437/200; 748/DIG. 15, DIG. 19

[56] References Cited

U.S. PATENT DOCUMENTS

| | | | |
|---|---|---|---|
| 4,587,718 | 5/1986 | Haken et al. | 437/200 |
| 4,755,478 | 7/1988 | Abernathey et al. | 437/41 |
| 4,877,755 | 10/1989 | Rodder | 437/200 |
| 4,994,410 | 2/1991 | Sun et al. | 437/192 |
| 5,034,348 | 7/1991 | Hartswick et al. | 437/200 |
| 5,094,981 | 3/1992 | Chung et al. | 437/190 |
| 5,322,809 | 6/1994 | Moslehi | 437/41 |
| 5,352,631 | 10/1994 | Sitaram et al. | 437/200 |

OTHER PUBLICATIONS

Wolf, S., Silicon Processing, vol. 2, 1990, Lattice Press, pp. 17–23, 144–151, 380–385.

Primary Examiner—T. N. Quach
Attorney, Agent, or Firm—Jacqueline J. Garner; Richard L. Donaldson; William E. Hiller

[57] ABSTRACT

A method of forming a self-aligned silicided gate (44) in a semiconductor device (10). A gate electrode having a conductive body (22) and a disposable cap (24) is formed on the surface of the semiconductor body. A sidewall spacer (32) is formed on the sidewall edges of the gate electrode. A surface dielectric (36) is formed over the exposed semiconductor surface adjacent the sidewall spacers (32) and field insulating layer (18). The disposable cap (24) prevents dielectric formation over gate electrode (22). Source/drain junction regions (34) are formed by ion implantation or another suitable doping method in the surface of the semiconductor body adjacent the gate electrode. The disposable cap (24) is then selectively removed and a silicide layer (40) is formed over the gate electrode using a self-aligned silicide react process. An optional additional self-aligned silicide process may be used to form a source/drain junction silicide layer which is thinner than the gate silicide layer (40).

5 Claims, 6 Drawing Sheets

SELF-ALIGNED SILICIDED GATE PROCESS

This application is a continuation of application Ser. No. 08/052,436, filed Apr. 22, 1993, now abandoned.

FIELD OF THE INVENTION

This invention generally relates to semiconductor device technologies and more specifically to self-aligned gate silicide processes.

BACKGROUND OF THE INVENTION

As the demand for more complex functions and higher performance in integrated circuits increases, it becomes necessary to reduce parasitic resistances of device structures as much as possible. One method which has been developed to reduce parasitic resistances involves self-aligned silicide (so called "SALICIDE") device structures. The conventional self-aligned silicide insulated-gate field-effect transistor (IGFET) device structures include silicide layers formed over source/drain junction regions and transistor polysilicon gate regions. Silicide has a much lower sheet resistance than doped polysilicon normally used to form the IGFET gate regions. As a result, when the gate regions are silicided, the low resistance silicide layer shunts the higher resistance polysilicon layer. Accordingly, the silicided gate structures reduce the parasitic gate resistance and IGFET gate propagation delay due to this silicide shunting effect. Moreover, the silicided source/drain junctions also have smaller parasitic resistance values and, as a result, allow larger extrinsic device transconductance values.

The silicidation process on source/drain junctions, however, can cause some possible problems in advanced sub-0.5 micron technologies. Because silicidation consumes a portion of the underlying silicon, deeper source/drain junction regions are typically required to prevent excessive junction leakage. However, deeper source/drain junctions result in increased short-channel effects such as drain-induced barrier lowering (DIBL) and punch-through leakage. Other problems include higher junction leakage, source/drain junction dopant loss to the silicide, and bridging problems leading to device manufacturing yield loss.

SUMMARY OF THE INVENTION

Generally, and in one form of the invention, a method of forming a self-aligned silicided gate in a semiconductor device is disclosed. A stacked bilayer structure consisting of a gate electrode having a conductive body and a disposable capping layer is formed on the surface of the semiconductor body. A dielectric may separate the gate electrode from the semiconductor body. A sidewall spacer is formed on the sidewall edges of the gate electrode. A plurality of source/drain junction regions are formed in the surface of the semiconductor body adjacent the gate electrode preferably using self-aligned doping processes. The disposable capping layer is then removed by, for example, using a selective nitride etch and a silicided gate is formed without forming any silicide over the source/drain junction and spacer regions.

An advantage of the invention is providing a self-aligned silicided gate process that minimizes silicon consumption in the source/drain junction regions, resulting in low junction leakage.

A further advantage of the invention is providing a self-aligned silicided gate process that enables a wider manufacturing process window for forming silicided device contacts.

A further advantage of the invention is providing a self-aligned silicided gate process that utilizes less complicated etching steps, such as those used for polycide gate structures.

Other advantages will be apparent to those skilled in the art having reference to this specification together with the accompanying drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The self-aligned silicided gate process according to the invention will be described herein as incorporated into an n-channel insulated-gate field-effect transistor (IGFET) manufactured using a CMOS process. It should, of course, be understood that the self-aligned silicided gate process according to the invention may be incorporated into various types of transistors which are constructed according to MOS, BiCMOS, or CMOS (both n-channel and p-channel IGFETs) technologies, each of which can utilize the benefits thereof.

Some device technology applications can benefit from a self-aligned silicided gate process without any silicide formation over the source/drain junction regions. For example, in some semiconductor memory technologies it is much more important to reduce the gate parasitic resistance and gate delay than the source/drain parasitic resistance. Moreover, the lack of silicided source/drain junctions provides a wider process window for forming silicided contacts to the source/drain junctions. This is due to the fact that only one silicide react process, i.e., that forming the silicided contacts, is performed, reducing the overall silicon consumption. If the surfaces of the source/drain junctions were silicided, then two silicide reacts would be performed, i.e., one to form the silicided source/drain junction and one to form the silicided contacts. Two silicide react processes further increase consumption of silicon over the source/drain regions and thus impose a deeper source/drain junction requirement.

One method of forming low-resistance gates involves depositing a layer of tungsten-silicide over a doped polysilicon layer and a gate oxide layer prior to the gate patterning process. The tungsten-silicide/polysilicon (polycide) stack is then etched to form the composite low-resistance gate. However, this usually entails a complicated multi-step plasma etch to pattern and define the composite polycide gate electrodes. Therefore, a self-aligned silicided gate process that does not entail such a complicated gate etch is desired.

Figure 1:
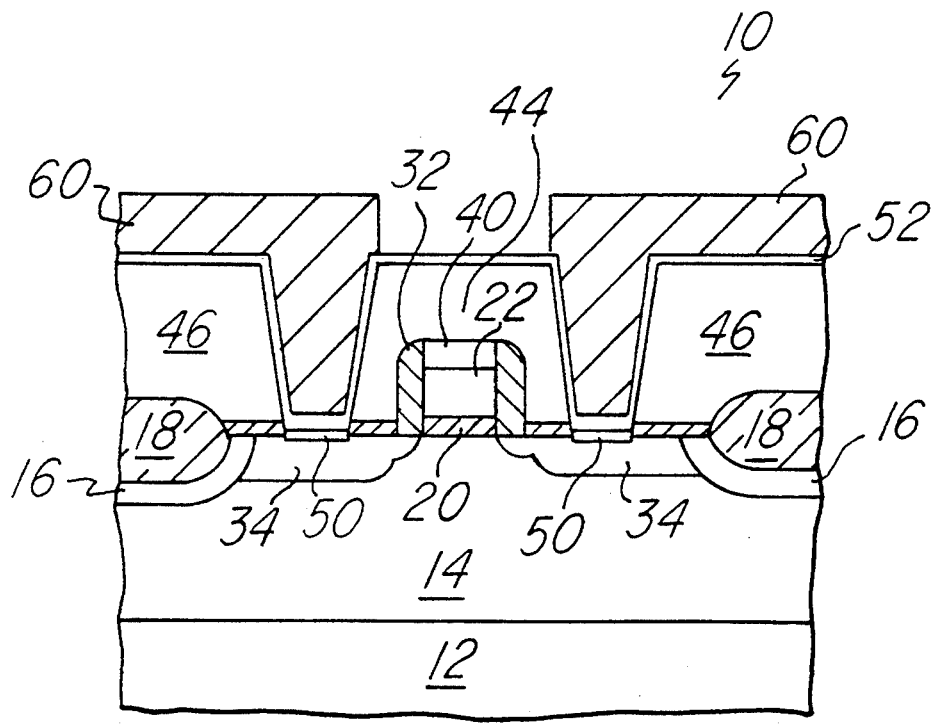
FIG. 1 is a cross-sectional diagram of a self-aligned silicided gate structure according to the preferred embodiment of the invention.

The self-aligned silicided gate structure of the preferred embodiment is shown in FIG. 1. Semiconductor body 10 includes a p-well 14 formed in substrate 12. Field insulating region 18 is located above channel stop region 16 in p-well 14 and may typically comprise an oxide material. Formed within p-well 14 are n+ source/drain junctions 34. An advantage of the invention is that source/drain junctions 34 may be shallow because no portion of the source/drain junction is consumed during the silicided gate process of the preferred embodiment. Accordingly, the risks associated with short channel effects are reduced. Silicided contacts 50 are located at the surface of source/drain junctions 34. Silicided gate 44 is separated from the surface of device channel 15 in p-well 14 by gate-insulator layer 20 and contains a silicide layer 40 and a doped polysilicon layer 22. Silicide layer 40 may be thicker with a lower sheet resistance than in prior art self-aligned silicidation processes because in the preferred embodiment there is no tradeoff between the thickness of silicide layer 40 and the depth of source/drain junctions because the source/drain junctions 34 are not silicided. Sidewall spacers 32 insulate the vertical edges of silicided gate 44 and can also define the effective device channel length. Inter-level dielectric 46 contains contact holes through which conductive layer 60 contacts source/drain junctions 34 through the refractory metal nitride contact barrier layer 52.

Figure 2A:
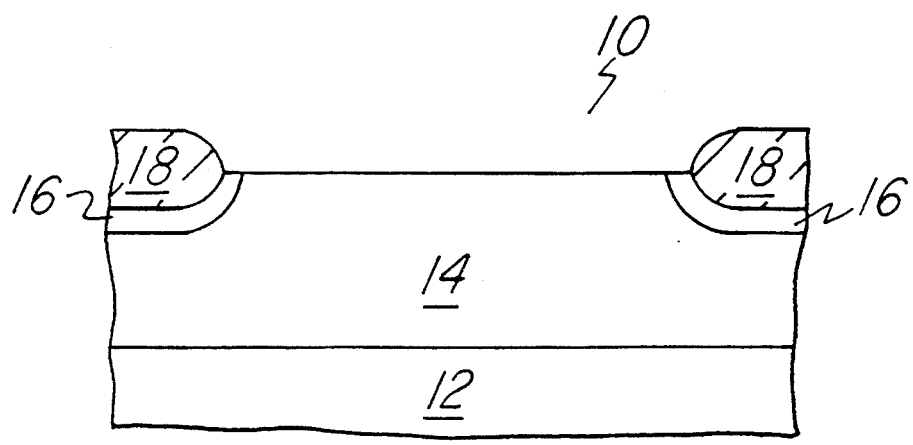
FIGS. 2a–2j are cross-section views of the preferred embodiment of the invention at various fabrication steps.

FIG. 2a is a cross-sectional diagram of a semiconductor body 10 having a silicon substrate 12 after the formation of p-well 14, channel stop region 16, and field insulating region 18. The formation of a self-aligned silicided gate in the structure of FIG. 2a will now be described. It should be noted that the formation of the channel stop regions 16 is optional and may be omitted.

Figure 2B:
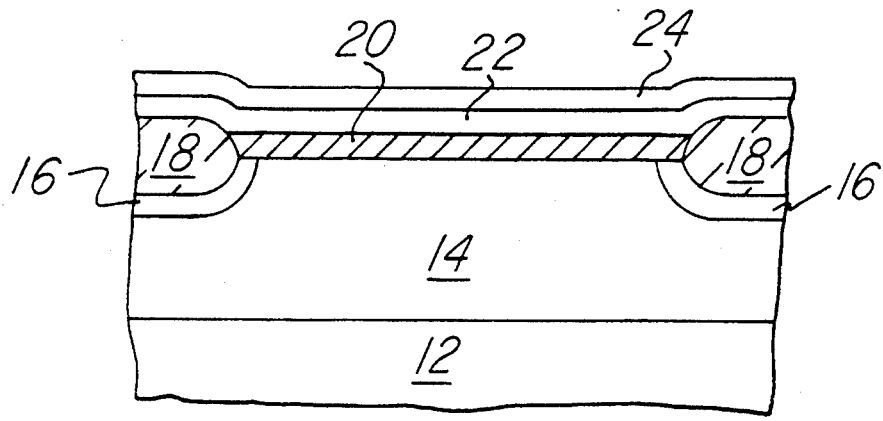
Figure 2C:
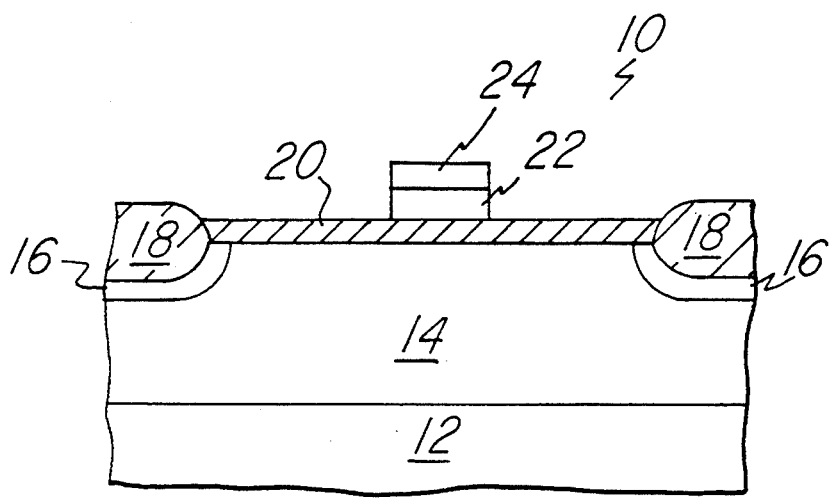

Referring to FIG. 2b, gate dielectric layer 20 is thermally grown on (or deposited) the surface of p-well 14 to a thickness on the order of 30–300 Å (for example, 60 Å for 0.25 $\mu$m devices). Polysilicon layer 22 is then deposited on the surface of gate dielectric layer 20 to a thickness on the order of 2000–4000 Å by LPCVD techniques. It will be apparent to those skilled in the art that other conductive materials may be used in place of polysilicon layer 22. Silicon nitride layer 24 is deposited on polysilicon layer 22, for example by low-pressure chemical-vapor deposition (LPCVD), to a thickness on the order of 200–1300 Å. Other methods of depositing silicon nitride layer 24, such as plasma-enhanced chemical-vapor deposition (PECVD), will be apparent to those skilled in the art. The nitride/polysilicon stack is then patterned by microlithography and an anisotropic plasma etch as shown in FIG. 2c. Methods for such an etch are well known in the art.

Figure 2D:
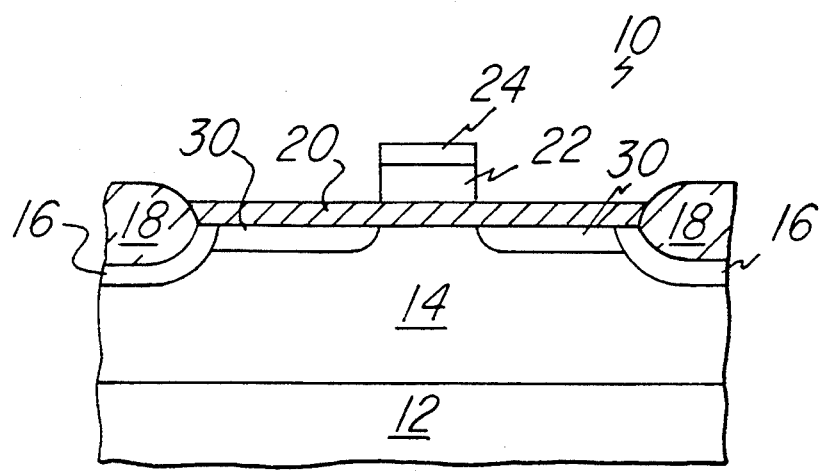
Figure 2E:
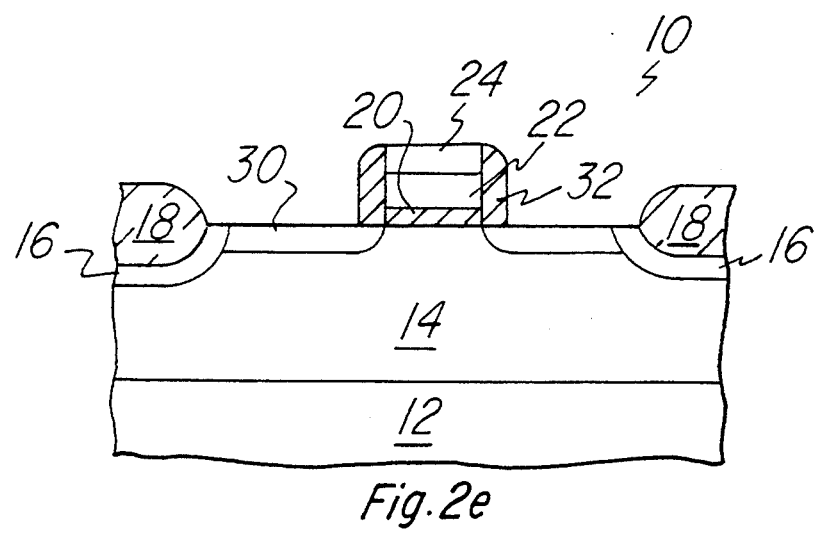
Figure 2F:
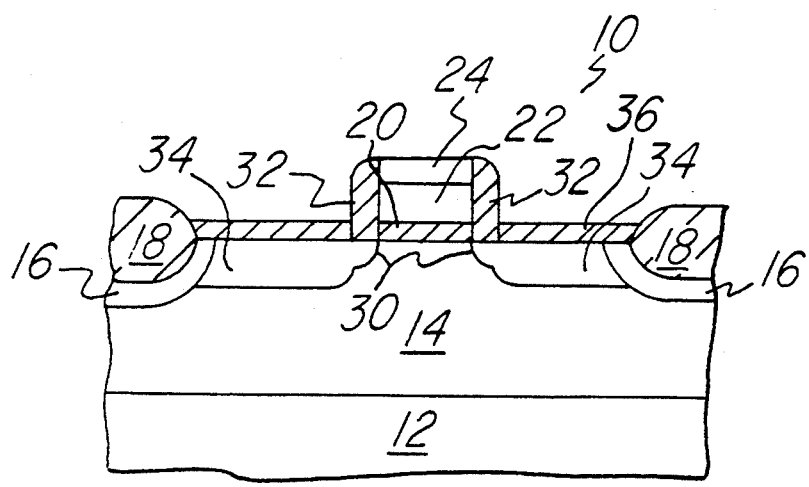

Referring to FIG. 2d, lightly doped drains (LDDs) 30 may optionally be formed now, by ion implantation through dielectric layer 20. LDD regions 30 will be self-aligned with the polysilicon layer 22 and field insulating region 18. Referring to FIG. 2e, sidewall spacers 32 may now be formed by conventional techniques comprising chemical-vapor deposition and anisotropic plasma etch. For example, a layer of silicon dioxide may be deposited and anisotropically etched to form sidewall spacers 32. However, the etch used in forming sidewall spacers 32 employs overetch and will typically also remove portions or all of dielectric layer 20 over source/drain junction regions 34. An oxide layer 36 may be thermally grown either prior to or after the formation of source/drain doped junction regions 34 to cover the source/drain region with a protective capping oxide layer, as shown in FIG. 2f. It will be apparent to those skilled in the art that other materials (with the exception of silicon nitride) may also be used. Oxide layer 36 will typically have a thickness on the order of 30–300 Å. Disposable silicon nitride layer 24 acts as an oxidation mask over the gate polysilicon layer 22. Source/drain junctions 34 are then formed by ion implantation of a dopant such as phosphorus and/or arsenic and are self-aligned with sidewall spacers 32 and field insulating regions 18.

Figure 2G:
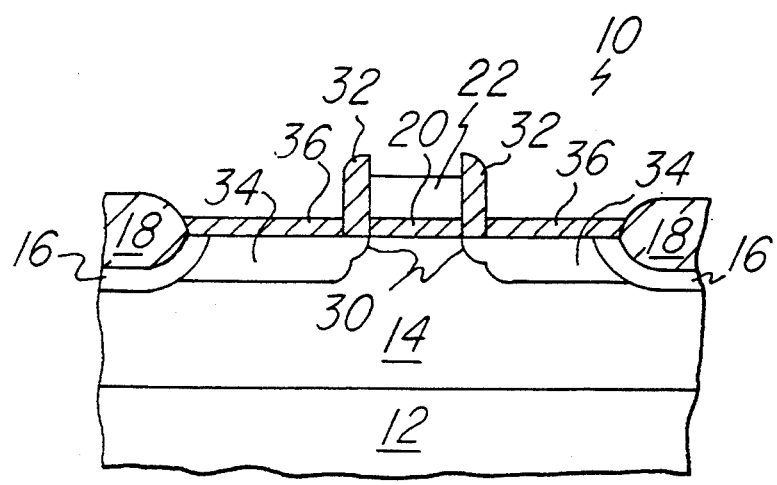
Figure 2H:
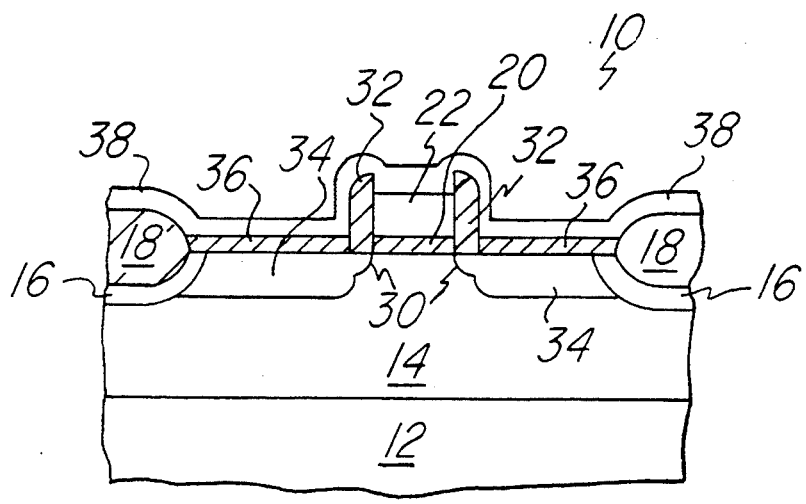
Figure 2I:
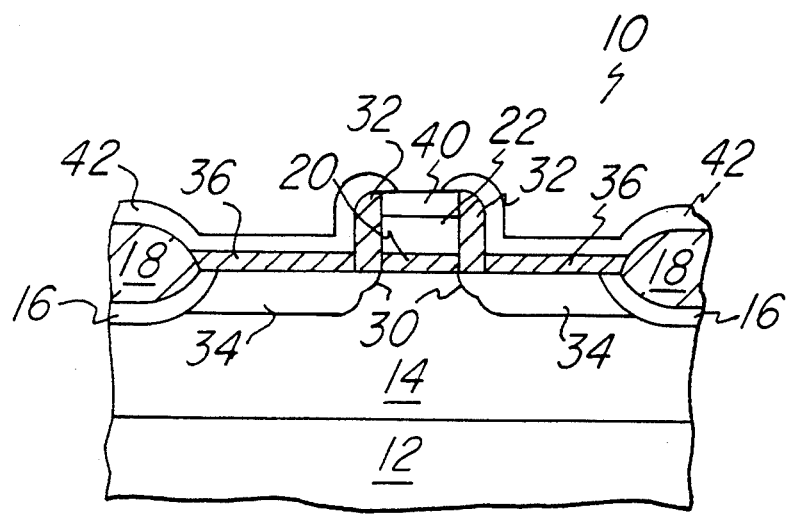

Referring to FIG. 2g, nitride layer 24 is selectively removed using a selective silicon nitride etch. Accordingly, no patterning step is required. Either a wet etch, such as a hot phosphoric acid etch, or a dry etch with an initial short HF deglaze may be used. A refractory metal layer 38, such as titanium or cobalt, is then deposited using a sputter deposition on the surface of semiconductor body 10, as shown in FIG. 2h. Titanium is used in the preferred embodiment. Referring to FIG. 2i, a self-aligned silicide or "SALICIDE" react process is performed which involves using a rapid thermal anneal or furnace anneal, in a nitrogen containing atmosphere. It will be obvious to those skilled in the art that an atmosphere of ammonia ($NH_3$) or argon may alternatively be used. Silicide layer 40 is only formed where the refractory metal layer 38 is in direct contact with exposed silicon, i.e., on polysilicon layer 22. No silicide is formed on the surface of source/drain junctions 34 because of oxide layer 36. A layer of titanium-nitride (TiN) 42 (an unsilicided layer) is formed during the SALICIDE process over field insulating region 18, sidewall spacers 32, and source/drain regions 34. TiN 42 may also contain some unreacted titanium. Finally, TiN layer 42, including any unreacted titanium, is removed using a selective etch such as a megasonic etch, leaving the gate silicide layer 40. A subsequent silicide anneal step may be performed.

Figure 2J:
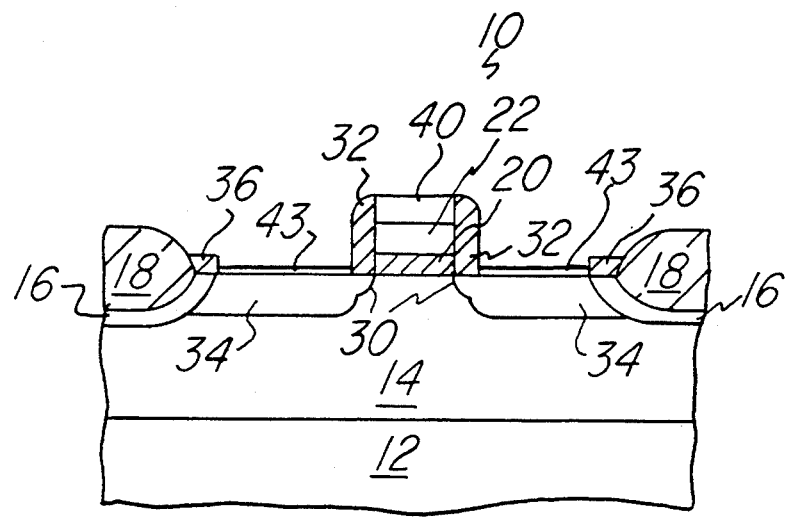

The silicide layer 40 over the gate polysilicon layer 22 can be made relatively thick without any detrimental impact on the source/drain junction regions 34. After this first salicide process it is possible to perform an optimal second salicide process as follows. The source/drain capping oxide layer 36 is selectively removed (using wet or vapor-phase HF deglaze) to expose the source/drain junction regions 34. A thin (200–400 Å) layer of refractory metal (e.g. titanium) is deposited by a technique such as sputtering. A react process is performed and the excess unreacted titanium and titanium nitride are selectively removed (a local interconnect layer may be performed using an extra masking step if desired) as shown in FIG. 2j. This second optional salicide process forms a relatively thin silicide layer 43 over the source/drain junction regions with reduced silicon consumption compatible with shallow source/drain junctions. The use of two separate salicide processes allows independent optimization of the gate silicide 40 and source/drain silicide 43 layers. For example, the gate silicide layer can be made fairly thick (e.g. 1000–1500 Å) while the source/drain junction silicide layer 43 is made relatively thin (e.g. <500 Å). If no source/drain silicide is needed, this optional second salicide process is not used. The remaining process steps are shown without the second salicide.

Figure 3A:
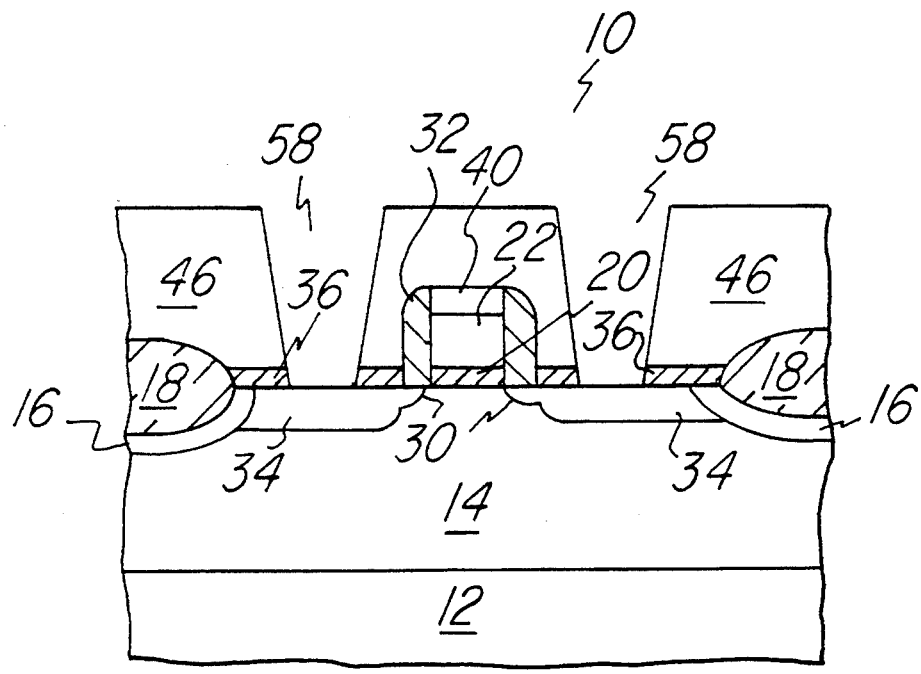
FIGS. 3a–3d are cross-sectional views of the preferred embodiment of the invention including interconnections at various fabrication steps.
Figure 3B:
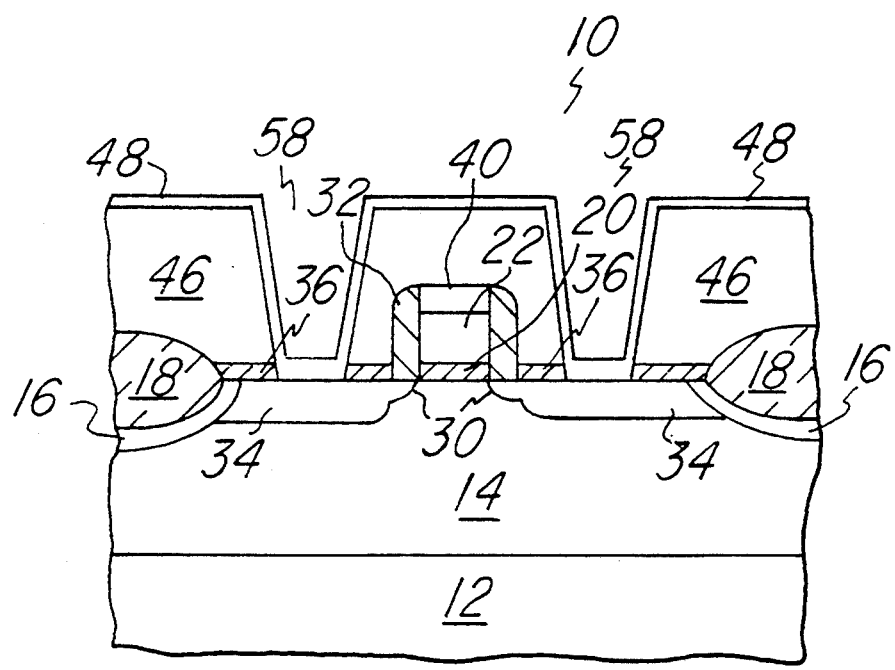
Figure 3C:
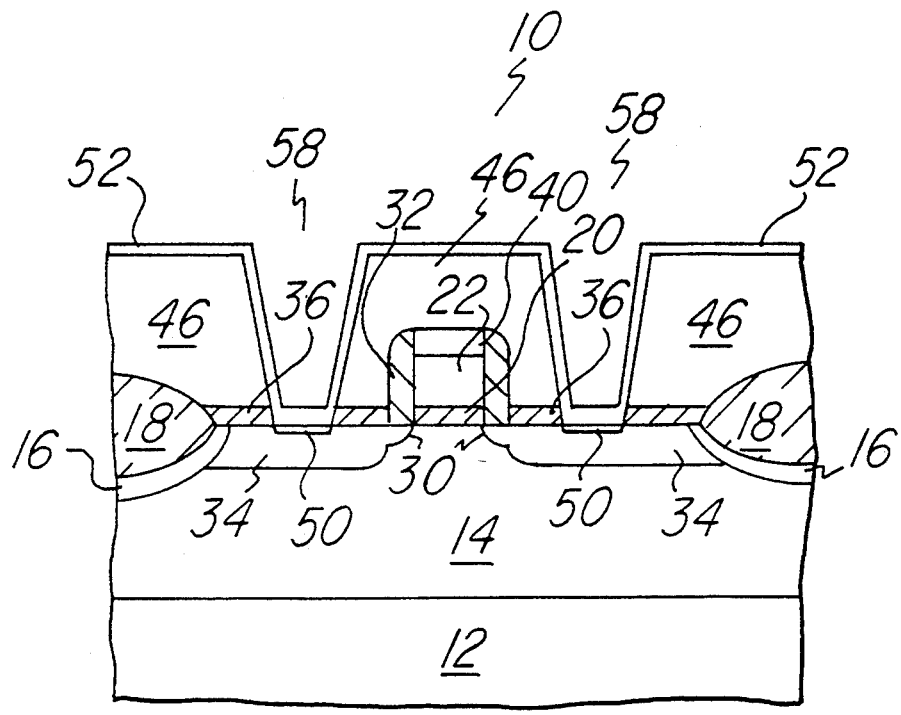
Figure 3D:
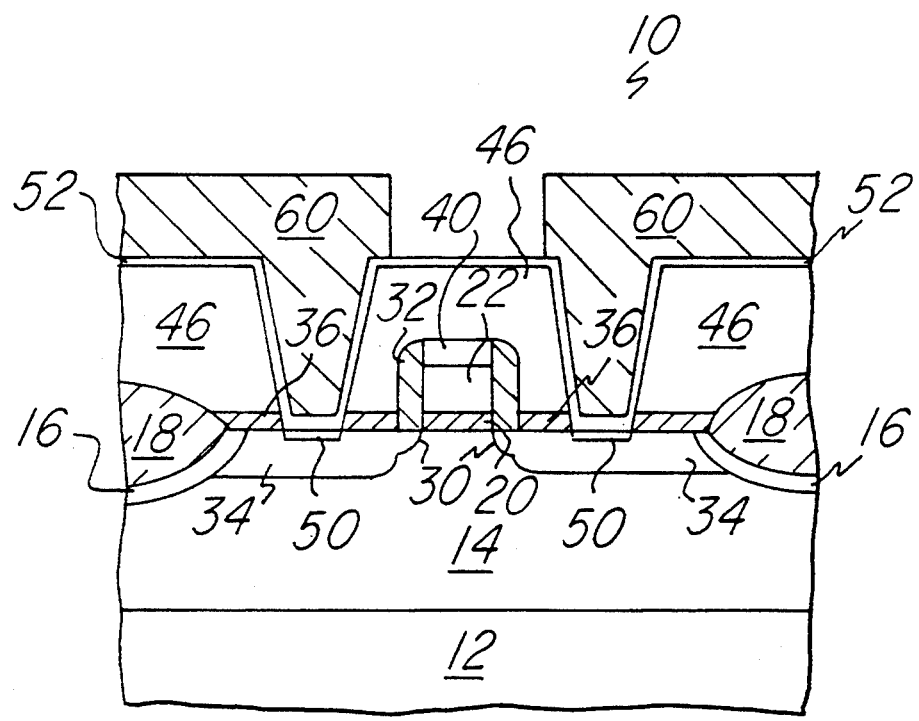

Subsequent to the completion of the method described above, interconnections between source/drain junctions 34, gates, and other elements (not shown) may be formed into semiconductor body 10. For example, an interlevel dielectric layer 46 consisting of undoped and doped oxide may be deposited on the surface of semiconductor body 10, as shown in FIG. 3a. Contact holes 58 are then etched into interlevel dielectric layer 46 and source/drain dielectric 36 to expose a portion of the surface of the source/drain junctions 34. A layer of refractory metal 48, such as titanium, may be deposited over the surface using sputter deposition, as shown in FIG. 3b. Referring to FIG. 3c, a silicide react process is performed as described above to form silicided contacts 50 on the surfaces of source/drain junctions 34 and TiN 52, an unsilicided nitrided layer, on top of silicided contacts 50 and elsewhere. TiN 52 may also contain some unreacted titanium. Because not all of the refractory metal layer 48 reacts with source/drain junctions 34, silicided contacts 50 comprise a layer of silicide and a layer of TiN used as a contact barrier layer. The amount of silicon in source/drain junctions 34 consumed in forming silicided contacts 50 is kept minimal. Finally, referring to FIG. 3d, a layer of conductive material 60, such as aluminum or tungsten, is deposited (by chemical-vapor deposition or sputtering) over the surface of the semiconductor body 10 and patterned and anisotropically etched to form interconnections among various devices in the integrated circuit (not shown). The fabrication process may continue in order to form more levels of electrical interconnects.

Subsequent to the methods described above, other elements as well as connections therebetween may be formed into semiconductor device 10. Methods for accomplishing this are well known in the art. Individual circuits are then separated from portions of substrate 12 and external connections made thereto by way of wire bonding, direct bump bonding, or the like, as is well known in the art. The individual circuits may then be packaged into a dual-in-line package, a chip carrier, or another type of package such as a multi-chip module. An example of such a package is described in U.S. Pat. No. 4,495,376 issued Jan. 22, 1985 and assigned to Texas Instruments, Inc.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method of forming a self-aligned silicided gate structure in a semiconductor device having a semiconductor body comprising the steps of
   a. forming a gate electrode on a surface of said semiconductor body, said gate electrode having a conductive body, and a disposable capping layer each having sidewalls;
   b. forming a sidewall spacer on said sidewalls of said conductive body and said disposable capping layer;
   c. forming a first dielectric layer on said surface of semiconductor body adjacent said gate electrode;
   d. forming a plurality of source/drain junction regions in said surface of said semiconductor body adjacent said gate electrode;
   e. removing said disposable capping layer;
   f. forming a silicided gate electrode using a self-aligned silicide process
   g. removing said dielectric layer by selective etch process after said step of forming said silicided gate electrode;
   h. depositing a layer of refractory metal over said semiconductor body;
   i. annealing said layer of refractory metal to form silicided source/drain junction regions and an unsilicided layer over said sidewall spacer and field insulating regions, wherein said unsilicided layer comprises refractory metal nitride, unreacted refractory metal, or both refractory metal nitride and unreacted refractory metal;
   j. selectively removing said unsilicided layer; and
   k. annealing said silicided source/drain junctions to reduce source/drain sheet resistance.

2. The method of claim 1, wherein said silicided source/drain junctions comprise a first silicide layer and said silicided gate electrode comprises a second silicide layer wherein said second silicide layer is thicker than said first silicide layer.

3. A method of forming an insulated-gate field-effect transistor having a substrate, comprising the steps of:
   a. forming a doped well region at a surface of said substrate;
   b. forming a field insulating region at a surface of said well region;
   c. forming a first dielectric layer at said surface of said well region surrounded by said field insulating region;
   d. depositing a polysilicon layer on said first dielectric layer;
   e. depositing a silicon nitride layer on said polysilicon layer;
   f. etching said polysilicon layer and said silicon nitride layer to form a gate electrode having sidewalls;
   g. forming sidewall spacers on said sidewalls of said silicon nitride layer and said polysilicon layer;
   h. forming a second dielectric layer above said well region between said gate electrode and said field insulating region;
   i. implanting a plurality of source/drain junction regions through said second dielectric layer;
   j. removing said silicon nitride layer using a selective etch;
   k. depositing a layer of refractory metal over said gate electrode, said second dielectric layer, and said field insulating region;
   l. annealing said layer of refractory metal to form a layer of silicide on the surface of said gate electrode and an unsilicided layer comprising a material selected from the group consisting of unsilicided refractory metal, metal nitride, or a combination thereof over said field insulating region and second dielectric layer; and
   m. selectively removing said unsilicided layer.

4. The method of claim 3, wherein said annealing step is performed in a nitrogen-containing atmosphere.

5. The method of claim 3, wherein said layer of refractory metal comprises titanium.

* * * * *